United States Patent
Ogura et al.

(10) Patent No.: US 6,279,871 B1
(45) Date of Patent: Aug. 28, 2001

(54) ACTUATOR DEVICE

(75) Inventors: Narumi Ogura; Mitsuteru Ide, both of Hyogo (JP)

(73) Assignee: Tokin Ceramics Corporation, Hyogo (JP)

( * ) Notice: Subject to any disclaimer, the term of this patent is extended or adjusted under 35 U.S.C. 154(b) by 0 days.

(21) Appl. No.: 09/323,297

(22) Filed: Jun. 1, 1999

(30) Foreign Application Priority Data

Jun. 2, 1998 (JP) .................................................. 10-152745

(51) Int. Cl.[7] .................................................... F16K 31/02
(52) U.S. Cl. ........................................................ 251/129.06
(58) Field of Search ....................... 251/129.06; 310/369, 310/328

(56) References Cited

U.S. PATENT DOCUMENTS

| | | | |
|---|---|---|---|
| 4,471,256 | * | 9/1984 | Igashira et al. ....................... 310/328 |
| 4,669,660 | | 6/1987 | Weber et al. . |
| 5,094,429 | * | 3/1992 | Dostert ............................. 251/129.06 |
| 5,094,430 | * | 3/1992 | Shirai et al. ...................... 251/129.06 |
| 5,145,147 | | 9/1992 | Nakazawa et al. . |
| 5,217,037 | * | 6/1993 | Bristol ............................. 251/129.06 |
| 5,239,223 | | 8/1993 | Miyoshi . |
| 5,251,871 | | 10/1993 | Suzuki . |
| 5,438,451 | | 8/1995 | Schweizer . |
| 5,868,375 | * | 2/1999 | Reinicke et al. ................. 251/129.06 |

FOREIGN PATENT DOCUMENTS

| | | |
|---|---|---|
| 35 01 077 A1 | 7/1986 | (DE) . |
| 42 32 079 A1 | 3/1994 | (DE) . |
| 0 325 764 A2 | 8/1989 | (EP) . |
| 4 425 599 | 12/1979 | (FR) . |

* cited by examiner

*Primary Examiner*—Kevin Shaver
*Assistant Examiner*—Eric Keasel
(74) *Attorney, Agent, or Firm*—Frishauf, Holtz, Goodman, Langer & Chick, P.C.

(57) ABSTRACT

An actuator device comprises an actuator element which has a shortest length when no electric voltage is applied and which is increased in length as an electric voltage applied thereto becomes higher, a displacement extracting part 17, and a converter mechanism for carrying out conversion of converting the change in length of the actuator element 11 into the displacement of the displacement extracting part 17. The converter mechanism comprises holders 14 and 13 and a transmission member 16 and carries out the conversion so that the displacement of the displacement extracting part 17 is decreased as the length of the actuator element 11 is increased. The converter mechanism carries out the conversion so that the displacement of the displacement extracting part 17 becomes maximum when the actuator element 11 has the shortest length.

7 Claims, 6 Drawing Sheets

US 6,279,871 B1

ACTUATOR DEVICE

BACKGROUND OF THE INVENTION

This invention relates to an actuator device for use as, for example, a driving section of a flow rate control valve of a flow rate control apparatus.

Generally, a conventional actuator device of the type comprises an actuator element which has a shortest length when no electric voltage is applied thereto and which is increased in length when an electric voltage applied thereto becomes higher, a displacement extracting part, and a converter mechanism for converting the change in length of the actuator element into the displacement of the displacement extracting part.

As will later be described, the converter mechanism of the conventional actuator device carries out conversion so that the displacement of the displacement extracting part is increased as the actuator element is increased in length. Thus, the conventional actuator device has a structure such that, as the electric voltage applied to the actuator element becomes higher, the length of the actuator element is increased so that the displacement of the displacement extracting part becomes greater.

It is assumed here that the actuator device is used as a driving section of a flow rate control valve of a flow rate control apparatus and that the actuator element is not supplied with the electric voltage because a power supply to the apparatus is interrupted by any accident (i.e., the actuator element is applied with a zero voltage). In this event, the length of the actuator element is shortest as mentioned above so that the displacement of the displacement extracting part is smallest. In response to the displacement of the displacement extracting part, the flow rate control valve puts a flow path into an open state.

As a result, when the power supply to the apparatus is interrupted by any accident, a large volume of a fluid such as a gas continuously flows through the flow path.

In order to eliminate the above-mentioned disadvantage, it is proposed to invert the displacement of the displacement extracting part of the actuator device by the use of an external mechanism separate from the converter mechanism. In this event, however, the actuator device inevitably becomes large in size.

SUMMARY OF THE INVENTION

It is therefore an object of this invention to provide a small-sized actuator device of a structure such that the displacement of a displacement extracting part is decreased as an applied voltage to an actuator element is increased.

It is another object of this invention to provide a flow rate control apparatus which comprises an actuator device mentioned above and which is capable of closing a flow path when a power supply to the actuator device is interrupted.

Other objects of this invention will become clear as the description proceeds.

According to this invention, there is provided an actuator device comprising an actuator element which has a shortest length when no electric voltage is applied thereto and which is increased in length as an electric voltage applied thereto becomes higher, a displacement extracting part, and a converter mechanism for carrying out conversion of converting the change in length of the actuator element into the displacement of the displacement extracting part, wherein the converter mechanism carries out the conversion so that the displacement of the displacement extracting part is decreased as the length of the actuator element is increased

DESCRIPTION OF THE PREFERRED EMBODIMENTS

Figure 1:
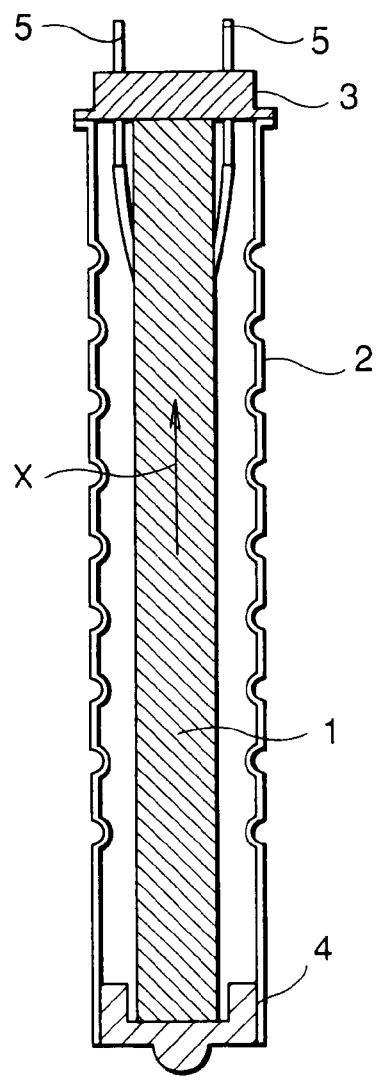
FIG. 1 is a side sectional view of a conventional actuator device.

Now, description will be made in detail as regards this invention with reference to the drawing.

In order to facilitate an understanding of this invention, description will at first be made about a conventional actuator device.

Figure 2:
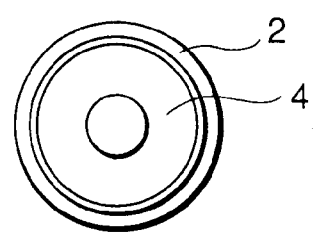
FIG. 2 is a bottom view of the actuator device illustrated in FIG. 1.

Referring to FIGS. 1 and 2, the conventional actuator device comprises a stacked piezoelectric actuator element 1 as a driving section. The stacked piezoelectric actuator element 1 comprises a stacked body including a plurality of piezoelectric members and a plurality of internal electrodes alternately stacked, and a pair of external electrodes attached to both side surfaces of the stacked body. The actuator device further comprises a pair of holders 3 and 4 fixed to both end faces of the stacked piezoelectric actuator element 1, respectively, a spring member 2 coupling the holders 3 and 4 to each other, and a pair of voltage application terminals 5 connected to the external electrodes, respectively. When the voltage application terminals 5 are applied with an electric voltage as an applied voltage, the device itself is displaced in a stacking direction (i.e., a longitudinal direction) X of the stacked piezoelectric actuator element 1. Herein, the displacement is increased in proportion to the applied voltage.

Figure 3:
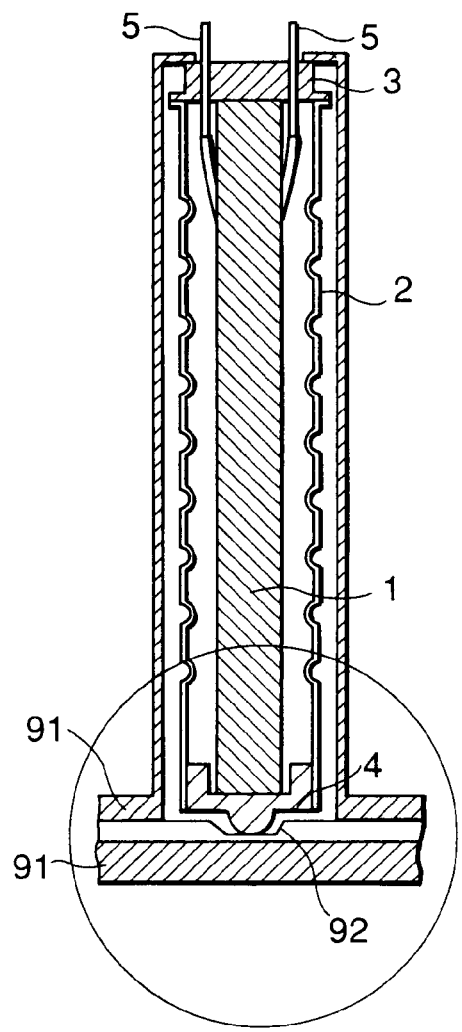
FIG. 3 is a side sectional view showing a characteristic part of a flow rate control apparatus using the actuator device illustrated in FIG. 1.
Figure 4:
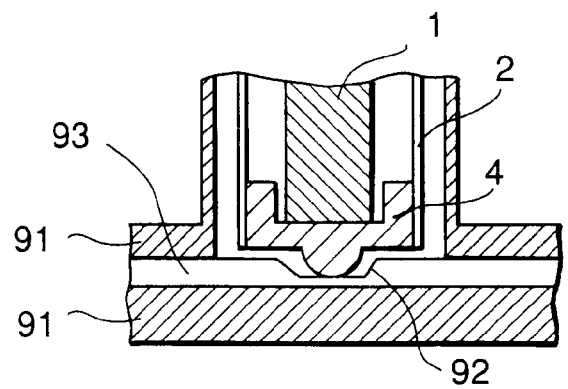
FIG. 4 is a n enlarged view showing an encircled region in FIG. 3.

Referring to FIGS. 3 and 4, a flow rate control apparatus 91 uses the above-mentioned actuator device as a driving section of a flow rate control valve 92. When the flow rate control apparatus 91 is energized, the stacked piezoelectric actuator element 1 is applied with an electric voltage as an applied voltage. The stacked piezoelectric actuator element 1 is displaced in proportion to the applied voltage to push the flow rate control valve 92 downward. The holder 4 and the flow rate control valve 92 move down to control the flow rate of a fluid such as a gas flowing through a flow path 93.

In the above-mentioned conventional actuator device, the displacement of the actuator element 1 is increased substantially in proportion to the applied voltage. Therefore, if the actuator device is used in the flow rate control apparatus 91 as described above and a power supply to the apparatus 91 is interrupted, the displacement of the stacked piezoelectric actuator element 1 is decreased. In this event, the flow rate control valve 92 and the holder 4 pushing down the flow rate control valve 92 move upward to put the flow path 93 in an open state. As a consequence, a large volume of the fluid such as a gas continuously flows through the flow path 93.

Now, description will be made in detail as regards an actuator device according to a first embodiment of this invention with reference to the drawing.

Figure 5:
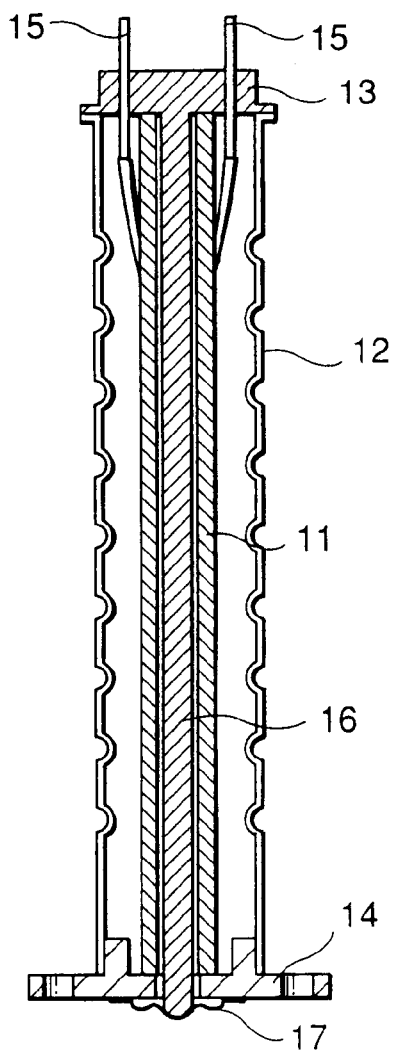
FIG. 5 is a side sectional view of an actuator device according to a first embodiment of this invention.
Figure 6:
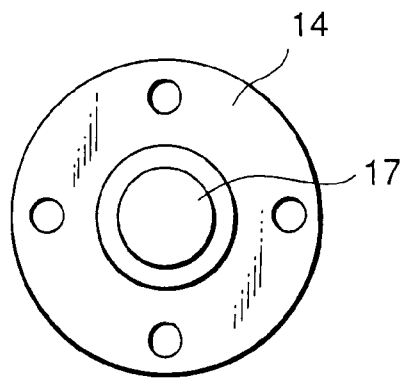
FIG. 6 is a bottom view of the actuator device illustrated in FIG. 5.

Referring to FIGS. 5 and 6, the actuator device of this embodiment comprises an actuator element 11 which has a shortest length when no electric voltage is applied and which is increased in length as an electric voltage applied thereto becomes higher, a displacement extracting part 17, and a converter mechanism for converting the change in length of the actuator element 11 into the displacement of the displacement extracting part 17. The actuator element 11 comprises a pair of voltage application terminals 15 to be applied with an electric voltage as an applied voltage. When the applied voltage is applied to the voltage application terminals 15, the actuator element 11 is increased in length as the applied voltage becomes higher.

The converter mechanism carries out conversion so that the displacement of the displacement extracting part 17 is decreased as the length of the actuator element 11 is increased.

The converter mechanism carries out conversion so that the displacement of the displacement extracting part 17 becomes maximum when the actuator element 11 has a shortest length.

More specifically, the actuator element 11 has a cylindrical shape with a through hole extending therethrough in a longitudinal direction.

The converter mechanism comprises a first holder 14 of a ring shape fixed to one end of the actuator element 11 and having a through hole, a second holder 13 fixed to the other end of the actuator element 11, and a transmission rod 16 having first and second ends and an intermediate portion between the first and the second ends. The first end of the transmission rod 16 is fixed to the second holder 13 so that the intermediate portion of the transmission rod 16 passes through the through hole of the actuator element 11 and the through hole of the first holder 14 and that the second end of the transmission rod 16 protrudes outward from the first holder 14. The second end of the transmission rod 16 acts as the displacement extracting part 17.

The displacement extracting part 17 illustrated in the figure comprises an extendable cover member which is fixed to the second end of the transmission rod 16 and to the first holder 14 and which covers a gap between a peripheral edge of the through hole of the first holder 14 and the transmission rod 16.

The converter mechanism further comprises a cylindrical spring member 12 which has both ends fixed to the first and the second holders 14 and 13, respectively.

The actuator element 11 may be a stacked piezoelectric actuator element.

Alternatively, the actuator element 11 may be a magnetostrictive element.

Description will be made about a method of producing the actuator device in case where the actuator element 11 is a stacked piezoelectric actuator element. At first, a through hole having a diameter of 3 mm is formed at the center of the stacked piezoelectric actuator element 11 having a size of 5 mm×5 mm×60 mm. The transmission rod 16 (made of a material such as iron, stainless steel, and ceramics) having an outer diameter of 2 mm is integrally fixed to the holder 13 and is made pass through the through hole so that the holder 13 is brought into contact with one end face of the stacked piezoelectric actuator element 11.

On the other hand, the holder 14 is provided with the through hole formed at the center and with the displacement extracting part 17 covering the through hole. An end of the transmission rod 16 is made to pass through the through hole of the holder 14 so that the displacement extracting part 17 and the end of the transmission rod 16 are fitted to each other and that the other end face of the stacked piezoelectric actuator element 11 is brought into contact with the holder 14.

Then, by the use of the cylindrical spring member 12 (for example, comprising a stainless steel pipe having a thickness of 0.15 mm and an inner diameter of 11 mm with reduced diameter portions formed at an interval of 5 mm to obtain a spring constant of 300 kg/mm), the holders 13 and 14 are coupled to each other so that the stacked piezoelectric actuator element 11 is applied with a load of about 80 kg·f. For example, the holder 13 and the spring member 12 are coupled by brazing while the holder 14 and the spring member 12 are coupled by resistance welding.

In the actuator device prepared in the above-mentioned manner, the holder 14 is fixed and the voltage application terminals 15 are applied with an electric voltage. In this event, the total length of the stacked piezoelectric actuator element 11 is extended to push the holder 13 upward. As a consequence, the transmission rod 16 fixed to the holder 13 is moved upward so that the displacement extracting part 17 is displaced. In this event, the displacement of the displacement extracting part 17 with respect to the bottom surface of the holder 14 is reduced as the applied voltage is increased.

Figure 7:
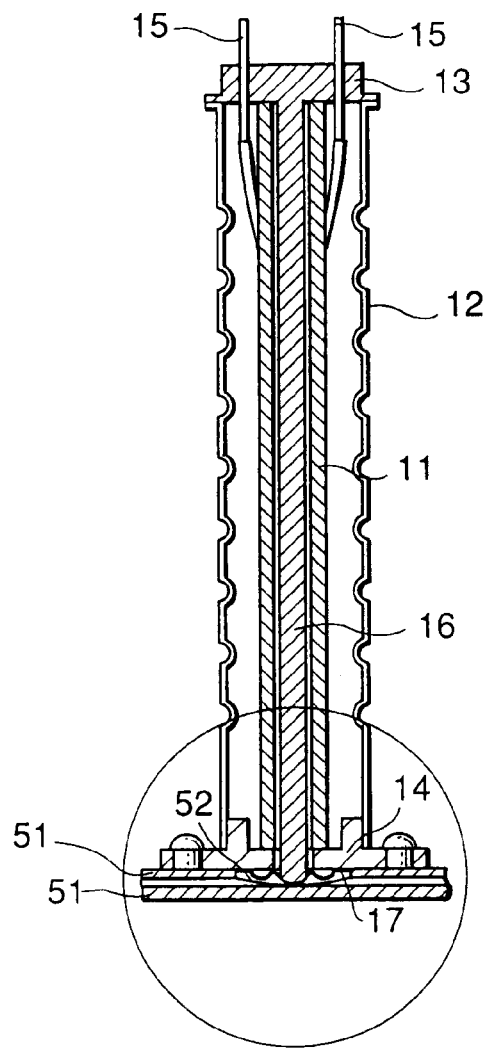
FIG. 7 is a side sectional view showing a characteristic part of a flow rate control apparatus using the actuator device illustrated in FIG. 5.
Figure 8:
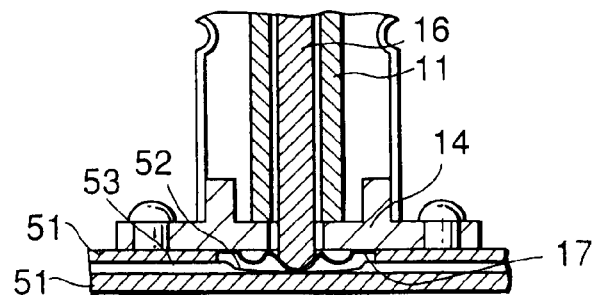
FIG. 8 is an enlarged view showing an encircled region in FIG. 7.
Figure 9:
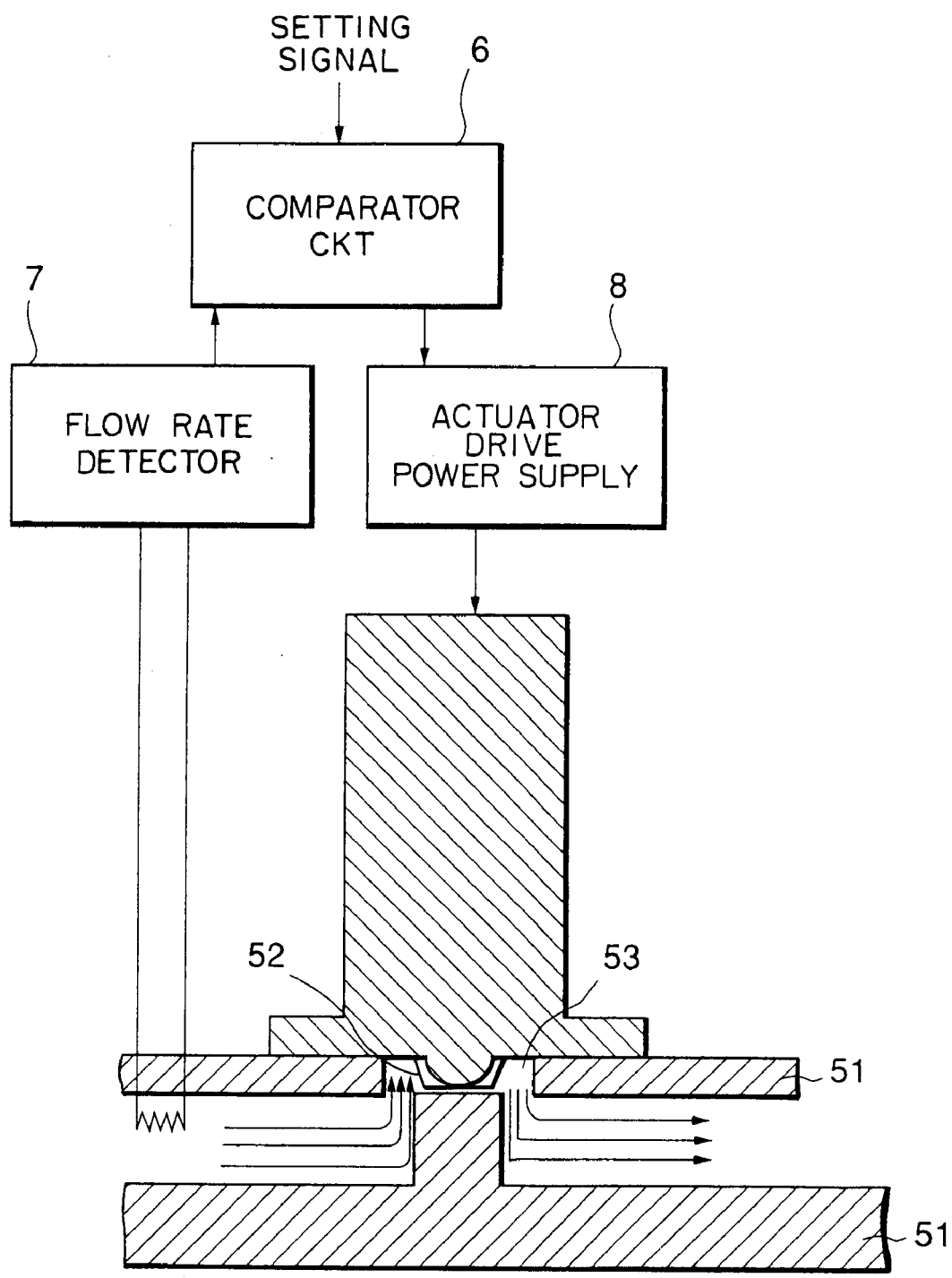
FIG. 9 is a view for describing the operation of the flow rate control apparatus illustrated in FIG. 7.

Referring to FIGS. 7 through 9, the above-mentioned actuator device is used in a flow rate control apparatus 51. The flow rate control apparatus 51 comprises a mass flow controller illustrated in FIG. 9.

The mass flow controller comprises a comparator circuit 6 supplied with a setting signal, a flow rate detector 7 for detecting a flow rate to produce a flow rate detection signal, and an actuator drive power supply 8 for supplying the actuator device with the applied voltage. The comparator circuit 6 compares the setting signal and the flow rate detection signal to produce a voltage control signal with reference to the result of comparison. In response to the voltage control signal supplied from the comparator circuit 6, the actuator drive power supply 8 produces the applied voltage which is supplied to the actuator device. In response to the applied voltage, the actuator device is increased or decreased in length. The flow rate control apparatus 51 is similar in structure to that described in conjunction with FIGS. 3 and 4. By the use of the actuator device of this embodiment as the driving section of a flow rate control valve 52, the flow rate control valve 52 is pushed upward or downward following the increase or the decrease in length of the actuator device. Thus, the flow rate in a flow path 53 is controlled.

Specifically, when the applied voltage to the voltage application terminals 15 becomes equal to zero in the above-mentioned flow rate control apparatus 51, the displacement of the stacked piezoelectric actuator element 11 of the actuator device is reduced so that the displacement extracting part 17 urged by spring force of the spring member 12 pushes the flow rate control valve 52 downward to close the flow path 53. It is therefore possible to prevent a large volume of a fluid such as a gas flowing through the flow path 53. Thus, the actuator device of this embodiment is very useful when it is applied to the flow rate control apparatus 51.

Figure 10:
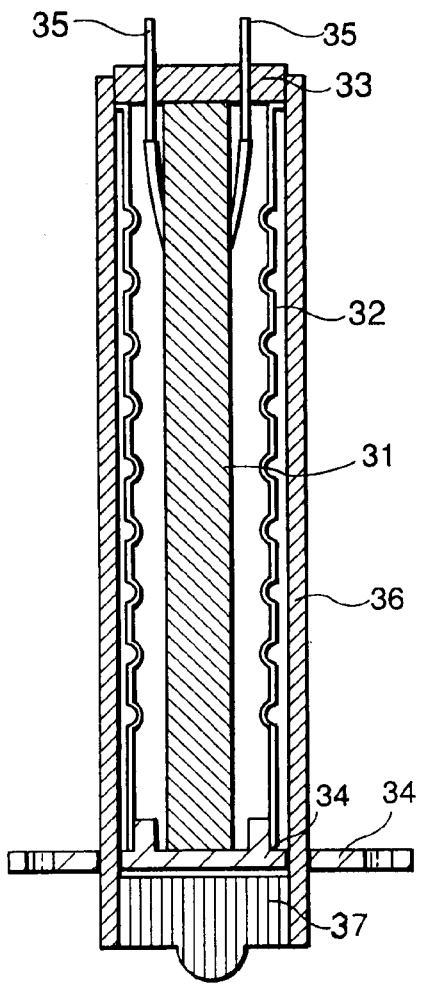
FIG. 10 is a side sectional view of an actuator device according to a second embodiment of this invention.
Figure 11:
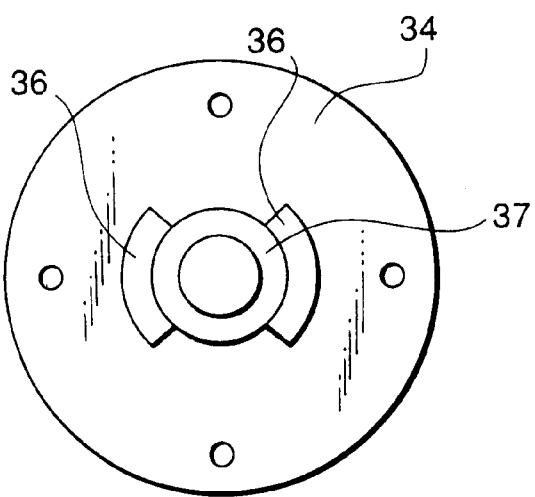
FIG. 11 is a bottom view of the actuator device illustrated in FIG. 10.

Referring to FIGS. 10 and 11, an actuator device according to a second embodiment of this invention comprises an actuator element 31 which has a shortest length when no electric voltage is applied and which is increased in length as an electric voltage applied thereto becomes higher, a displacement extracting part 37, and a converter mechanism for converting the change in length of the actuator element 31 into the displacement of the displacement extracting part 37. The actuator element 31 comprises a pair of voltage application terminals 35 to be applied with an electric voltage as an applied voltage. When the applied voltage is applied to the voltage application terminals 35, the actuator element 31 is increased in length as the applied voltage becomes higher.

The converter mechanism carries out conversion so that the displacement of the displacement extracting part 37 is decreased as the length of the actuator element 31 is increased.

Specifically, the converter mechanism comprises a first holder 34, a second holder 33, and a cylindrical transmission member 36. The first holder 34 has a center portion fixed to one end of the actuator element 31, a peripheral portion surrounding the center portion, and notches formed between the center portion and the peripheral portion. The second holder 33 is fixed to the other end of the actuator element 31. The cylindrical transmission member 36 has first and second ends and an intermediate portion between the first and the second ends. The one end of the transmission member 36 is fixed to the second holder 33 so that the intermediate portion of the transmission member 36 covers the actuator element 31 with a gap and that the second end of the transmission member 36 passes through the notches of the first holder 34 to protrude outward from the first holder 34.

The displacement extracting part 37 is fixed to the second end of the transmission member 36.

The converter mechanism further comprises a cylindrical spring member 32. The cylindrical spring member 32 is formed in the gap between the actuator element 31 and the intermediate portion of the transmission member 36 covering the actuator element 31, and has both ends fixed to the center portion of the first holder 34 and the second holder 33, respectively.

The actuator element 31 may be a stacked piezoelectric actuator element.

Alternatively, the actuator element 31 may be a magnetostrictive element.

Description will be made about a method of producing the actuator device in case where the actuator element 31 is a stacked piezoelectric actuator element. At first, one end of the stacked piezoelectric actuator element 31 having a size of 5 mm×5 mm×60 mm is brought into contact with the holder 33 while the other end is made to pass through the notches of the holder 34. By the use of the cylindrical spring member 32 (for example, comprising a stainless steel pipe having a thickness of 0.15 mm and an inner diameter of 11mm with reduced diameter portions formed at an interval of 5 mm to obtain a spring constant of 300 kg/mm) having an inner diameter of 11 mm, inner portions of the holders 33 and 34 are coupled to each other so that the stacked piezoelectric actuator element 31 is applied with a load of about 80 kg·f. For example, the holder 33 and the spring member 32 are coupled by brazing while the holder 34 and the spring member 32 are coupled by resistance welding.

Next, one end of the transmission member 36 comprising a stainless steel pipe having a thickness of 0.15 mm and an inner diameter of 18 mm is fixed to the holder 33. Thereafter, the other end of the transmission member 36 is made to pass through the notches of the holder 34 and is provided with the displacement extracting part 37.

In the actuator device prepared in the above-mentioned manner, the displacement of the displacement extracting part 36 is reduced following the increase of the applied voltage applied to the stacked piezoelectric actuator element 31, like in the first embodiment. Therefore, if the actuator device is used as the driving section for the flow rate control valve 52 of the flow rate control apparatus 51, the flow path 53 can be closed upon interruption of power supply. It is thus possible to prevent a large volume of a fluid such as a gas from flowing through the flow path 53.

As described above, according to this invention, it is possible to obtain the small-sized actuator device of a structure such that the displacement of the displacement extracting part is decreased as the applied voltage applied to the actuator element becomes higher.

Furthermore, according to this invention, it is possible by the use of the above-mentioned actuator device to obtain the flow rate control apparatus which is capable of closing the flow path upon interruption of power supply to the actuator device.

What is claimed is:

1. An actuator device comprising:
   an actuator element which has a shortest length when no electric voltage is applied thereto and which is increased in length as an electric voltage applied thereto becomes higher, said actuator element having a cylindrical shape with a through hole penetrating therethrough in a longitudinal direction of said actuator element;
   a displacement extracting part; and
   a converter mechanism which carries out conversion of a change in length of said actuator element into a displacement of said displacement extracting part;
   wherein said converter mechanism carries out said conversion so that the displacement of said displacement extracting part is decreased as the length of said actuator element is increased, and so that the displacement of said displacement extracting part becomes maximum when said actuator element has said shortest length;
   wherein said converter mechanism comprises:
   a first holder fixed to a first end of said actuator element and having a through hole,
   a second holder fixed to a second end of said actuator element,
   a transmission rod having first and second ends and an intermediate portion between said first and said second ends, said first end of said transmission rod being fixed to said second holder so that said intermediate portion of said transmission rod penetrates through the through hole of said actuator element and the through hole of said first holder and so that said second end of said transmission rod protrudes outward from said first holder, and
   a cylindrical spring member said cylindrical spring member having first and second ends fixed to said first and said second holders, respectively; and
   wherein said extracting displacement part comprises said second end of said transmission rod.

2. An actuator device as claimed in claim 1, wherein said actuator element comprises a stacked piezoelectric actuator element.

3. An actuator device as claimed in claim 1, wherein said actuator element comprises a magnetostrictive element.

4. A flow rate control apparatus comprising:

a flow rate control valve that controls a flow rate in a flow path, and the actuator device as claimed in claim 1 coupled to said flow rate control valve, wherein said flow rate control valve closes said flow path in response to the displacement of said displacement extracting part of said actuator device, when no electric voltage is applied to said actuator element of said actuator device.

5. A flow rate control apparatus comprising:

a flow rate control valve that controls a flow rate in a flow path, and an actuator device coupled to said flow rate control valve, wherein said actuator device comprises:

an actuator element which has a shortest length when no electric voltage is applied thereto and which is increased in length as an electric voltage applied thereto becomes higher, a displacement extracting part, and a converter mechanism which carries out conversion of a change in length of said actuator element into a displacement of said displacement extracting part;

wherein said converter mechanism comprises:

a first holder having a center portion fixed to a first end of said actuator element, a peripheral portion surrounding said center portion, and a notch formed between said center portion and said peripheral portion, a second holder fixed to a second end of said actuator element, and a transmission member of a cylindrical shape having first and second ends and an intermediate portion between said first and said second ends, said first end of said transmission member being fixed to said second holder so that said intermediate portion of said transmission member covers said actuator element with a gap between said intermediate portion and said actuator element and so that said second end of said transmission member passes through said notch of said first holder to protrude outward from said first holder;

wherein said displacement extracting part is fixed to said second end of said transmission member wherein:

said converter mechanism further comprises a cylindrical spring member, said cylindrical spring member is arranged in said gap between said actuator element and said intermediate portion of said transmission member covering said actuator element, and said spring member has a first end fixed to said center portion of said first holder and a second end fixed to said second holder;

wherein said converter mechanism carries out said conversion so that the displacement of said displacement extracting part is decreased as the length of said actuator element is increased; and wherein said flow rate control valve closes said flow path in response to the displacement of said displacement extracting part of said actuator device, when no electric voltage is applied to said actuator element of said actuator device.

6. An actuator device as claimed in claim 5, wherein said actuator element comprises a stacked piezoelectric actuator element.

7. An actuator device as claimed in claim 5, wherein said actuator element comprises a magnetostrictive element.

* * * * *